(12) United States Patent
Flader

(10) Patent No.: US 11,211,258 B2
(45) Date of Patent: Dec. 28, 2021

(54) METHOD OF ADDRESSING DISSIMILAR ETCH RATES

(71) Applicant: INVENSENSE, INC., San Jose, CA (US)

(72) Inventor: Ian Flader, Redwood City, CA (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 16/843,214

(22) Filed: Apr. 8, 2020

(65) Prior Publication Data

US 2020/0328090 A1 Oct. 15, 2020

Related U.S. Application Data

(60) Provisional application No. 62/831,681, filed on Apr. 9, 2019, provisional application No. 62/914,014, filed on Oct. 11, 2019.

(51) Int. Cl.
| | |
|---|---|
| *H01L 21/3213* | (2006.01) |
| *H01L 21/32* | (2006.01) |
| *H01L 21/311* | (2006.01) |
| *H01L 21/308* | (2006.01) |

(52) U.S. Cl.
CPC .... *H01L 21/32139* (2013.01); *H01L 21/3081* (2013.01); *H01L 21/31144* (2013.01); *H01L 21/32* (2013.01)

(58) Field of Classification Search
CPC ...... G06N 10/00; G11C 11/44; H03K 19/195; B81C 1/00587; B81C 2201/0112; B81C 2201/0132; H01L 21/3081; H01L 21/31144; H01L 21/32; H01L 21/32139
USPC .... 438/714, 717, 719, 723, 736; 216/41, 47, 216/72
See application file for complete search history.

(56) References Cited

U.S. PATENT DOCUMENTS

| | | | | |
|---|---|---|---|---|
| 2002/0158040 | A1* | 10/2002 | Lucak | B81C 1/00484 216/2 |
| 2011/0026742 | A1* | 2/2011 | Huang | B81C 1/0023 381/174 |
| 2017/0366107 | A1* | 12/2017 | Chatterjee | H03H 3/0077 |

* cited by examiner

*Primary Examiner* — Lan Vinh
(74) *Attorney, Agent, or Firm* — Amin, Turocy & Watson, LLP

(57) ABSTRACT

A method for DRIE matched release and/or the mitigation of photo resist pooling, comprising: depositing a first mask layer over a first surface of a silicon substrate; exposing a first portion and second portion of the first mask layer to a first etch process, wherein the exposing forms a first exposed layer; depositing a second mask layer over the first mask layer; exposing a third portion of the second mask layer to a second etch process, wherein the exposing forms a second exposed mask layer, and wherein the third portion overlaps the first portion of the first mask layer; developing the second mask layer and etching the third portion of the second mask layer and developing the first portion of the first mask layer; etching the first portion of the first mask layer to a first depth; and developing the first mask layer to reveal exposed portions of the first mask layer and etching the second portion of the silicon substrate to a second depth.

18 Claims, 16 Drawing Sheets

METHOD OF ADDRESSING DISSIMILAR ETCH RATES

CROSS REFERENCE TO RELATED APPLICATIONS

This application claims priority to U.S. Provisional Patent Application Ser. No. 62/831,681, titled: "DRIE MATCHED RELEASE," filed Apr. 9, 2019, and U.S. Provisional Patent Application Ser. No. 62/914,014, titled "PR POOLING MITIGATION," filed Oct. 11, 2019, the disclosures of which are hereby incorporated herein by reference in their entireties.

TECHNICAL FIELD

The subject disclosure relates to deep reactive ion etching (DRIE) matched release and for the mitigation of photoresist (PR) pooling.

BACKGROUND

Variations in etching rates can be dependent on pattern densities and/or features widths. For instance, the etching of some microelectromechanical systems (MEMS) features can be etched through device silicon faster than other features. This mismatch in etch rates can lead to non-uniformity issues of the etched features which in turn can impact device performance. To date, in order to compensate for the variation and/or disparities in etch rates, the current praxis has been to make adjustments in terms of layout geometries, feature sizes, and/or featured densities.

Topological features on wafers can create thickness variations in photo resist (PR) spun on thicknesses. photo resist thickness typically can determine critical feature definitions during photolithography. Therefore, topological features themselves can create photo resist thickness variations that in turn can cause undesirable variations in critical feature dimensions. At the moment, there are no implemented techniques that address photo resist thickness variations ensuing as a result of the topologies of the features developed on the wafer.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with various embodiments set forth herein, the subject disclosure provides a process to compensate for the disparities between etch rates by selectively pre-etching features that can be slower to etch, e.g., features that are etched at the slower rates based on having greater device pattern geometry densities and/or differing physical dimensions. As will be appreciated by persons having ordinary skill in the art, the etch rate can be determined or is determinable as a function of the density of the geometric patterns that define a particular MEMS device as well as the width, depth, and/or length (e.g., physical dimensions) of the created MEMS device. Thus, less dense MEMS pattern geometries and/or smaller physical dimensions typically can have faster etch rates in comparison to higher density MEMS pattern geometries and/or larger physically dimensioned MEMS devices, which can generally have slower etch rates.

In accordance with some embodiments more than one photo resist layer (or mask layer) can be used, wherein a first photo resist layer can be spun on and exposed to a source of electromagnetic radiation (e.g., a light), but not developed. Once the initial photo resist layer has been exposed, but not developed, additional photo resist layers can be spun on, exposed, and/or developed. Generally, features to be exposed can be pre-etched using a highly and anisotropic etching process to create deep penetration, steep sided holes and/or trenches in semiconductor wafers (or semiconductor substrates), wherein the holes and/or trenches have defined or definable aspect ratios. An example of a highly anisotropic etching process is a deep reactive ion etch (DRIE). Nevertheless, as will be understood by those of ordinary skill, other etching processes can be used to facilitate creation of deep penetrating, steep sided holes, and/or trenches with determined and/or determinable aspect ratios, any and/or all of these additional etching processes, individually and/or in combination, are contemplated as falling within the purview of the subject disclosure.

The additional photo resist layers can thereafter be removed, revealing an initial photo resist layer (or underlying photo resist layers—where there are multiple additional photo resist layers). The first photo resist layer (or an underlying photo resist layer) can then be developed using an appropriate developing solution. A final etching can thereafter be effectuated using a highly anisotropic etching process (e.g., DRIE).

In regard to the foregoing it should be noted that while the disclosure is exposited using photo resist photo resist masks, combinations of photo resist photo resist masks and/or hard masks can be utilized with equal functionality and/or facility without necessarily departing from the scope and/or intent of the subject disclosure. Moreover, as will be understood by those of ordinary skill, use of two masks (PR masks and/or hard masks) can provide more etch uniformity.

In additional and/or alternative embodiments, the subject disclosure describes the use of one or more initial masks to pattern critical MEMS geometries. Thereafter, additional masks can be patterned over the initial mask to define features of less critical MEMS layers.

The described embodiments mitigate photo resist photo resist thickness variations caused by way for topologies by providing on feature dimensional variations and targets.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present disclosure will be apparent upon consideration of the following detailed description, taken in conjunction with the accompanying drawings, in which like reference characters refer to like parts throughout, and in which.

DETAILED DESCRIPTION

Figure 1:
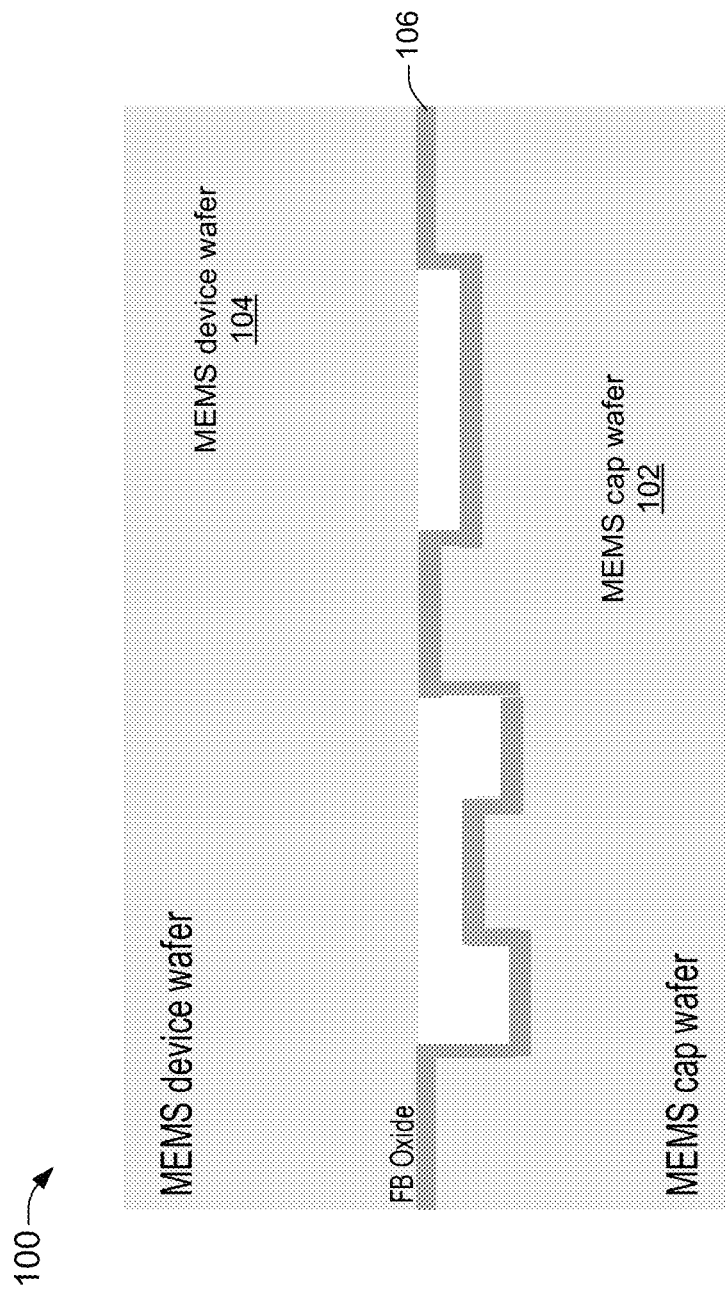
FIG. 1 illustrates a cross sectional view of a fabrication of a MEMS device to compensate for the disparities between etch rates by selectively pre-etching features that can be slower to etch, in accordance with various embodiments set forth in this disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

In accordance with some embodiments, the subject disclosure describes methods comprising depositing a first mask layer over a first surface of a silicon substrate; exposing a first portion and second portion of the first mask layer to a first etch process, wherein the exposing forms a first exposed layer representing a critical dimension geometry associated with a fabricated device; depositing a second mask layer over the first mask layer; exposing a third portion of the second mask layer to a second etch process, wherein the exposing forms a second exposed mask layer representing dimension geometries of secondary importance to the fabricated device, and wherein the third portion overlaps the first portion of the first mask layer; developing the second mask layer and etching the third portion of the second mask layer and developing the first portion of the first mask layer; etching the first portion of the first mask layer to a first depth; and developing the first mask layer to reveal exposed portions of the first mask layer and etching the second portion of the silicon substrate to a second depth.

In some embodiments, the first portion of the silicon substrate can comprise slow etching features representing densely packed microelectromechanical device features. In additional embodiments, the second portion of the silicon substrate can comprise fast etching features representing less densely packed microelectromechanical device features. In other embodiments, the first mask layer comprise an oxide hardmask layer, a metal mask layer, or a silicon nitride layer. In additional embodiments, the second mask layer can comprise a photoresist layer.

Additional acts can include removing the second mask layer before developing the first mask layer; and performing a completion etch process to reveal at least one hole.

In various other embodiments the subject application details a method, comprising: depositing a first mask layer over a first surface of a silicon substrate; exposing a first portion of the first mask layer to a first etch process, wherein the exposing forms a first exposed mask layer; depositing a second mask layer over the first mask layer and the first exposed mask layer; exposing a second portion of the second mask layer to a second etch process, wherein the second portion of the second mask layer overlaps the first portion of the first mask layer, and wherein the exposing of the second portion form a second exposed mask layer;

exposing a third portion of the second mask layer; developing the first exposed mask layer and the second exposed mask layer; and etching the silicon substrate.

In addition acts can include depositing a rough polysilicon layer directly over the silicon substrate before deposition of the first mask layer; depositing a germanium layer over the rough polysilicon layer before deposition of the first mask layer; etching the germanium layer to form a standoff structure comprising germanium; etching the rough polysilicon layer to form a standoff structure comprising rough polysilicon; and removing the first mask layer. Further acts can also include removing the second mask layer; and etching the silicon substrate to form a standoff structure. In accordance with the foregoing the first mask layer can comprise an oxide hardmask, a metal mask, a silicon nitride mask, or a photo resist, and the second mask layer comprise a photo resist.

FIG. 1, in accordance with various embodiments, depicts a bonded engineered silicon on insulator wafer 100 comprising a MEMS cap wafer 102 and a MEMS device wafer 104, wherein an insulator layer 106 (e.g., fusion bond oxide) can be formed between the MEMS cap wafer 102 and the MEMS device wafer 102.

Figure 2:
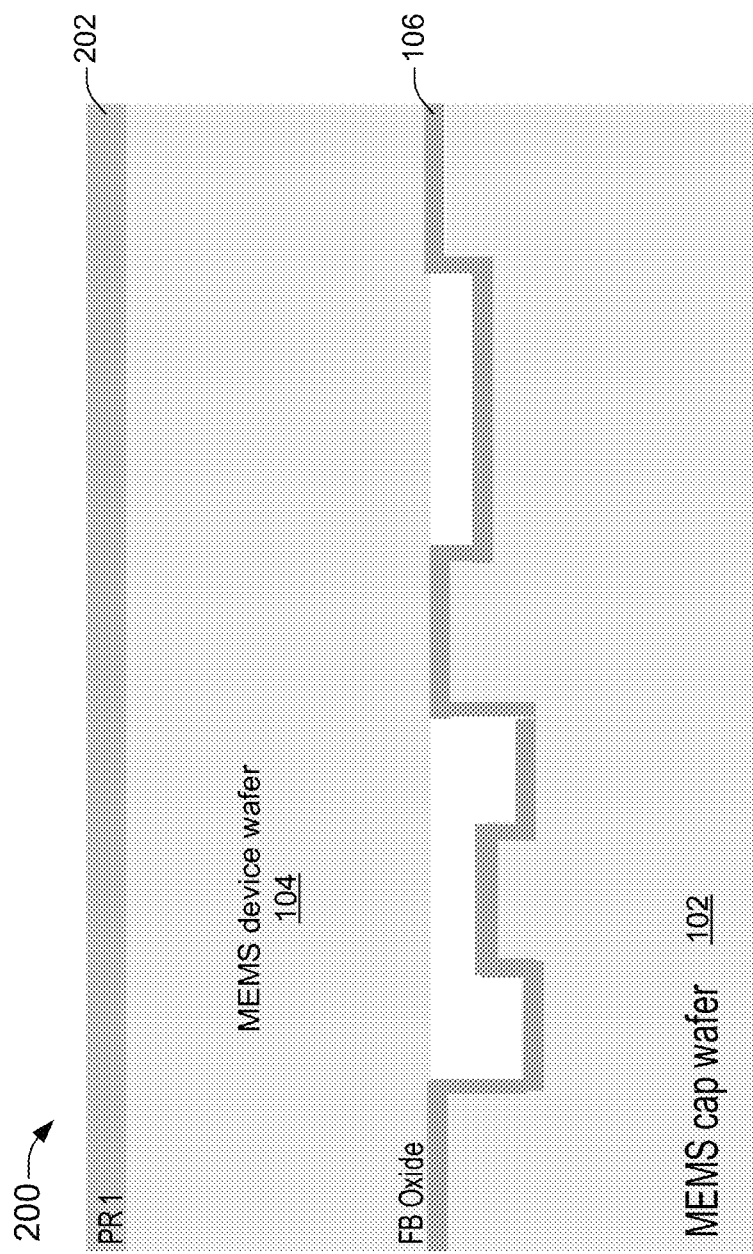
FIG. 2 illustrates a cross sectional view of a fabrication of a MEMS device to compensate for the disparities between etch rates by selectively pre-etching features that can be slower to etch, in accordance with various embodiments set forth in this disclosure.

FIG. 2 provides additional illustration of engineered silicon on insulator wafer 100 (now numbered 200), in accordance with various embodiments. In this instance, engineered silicon on insulator wafer 200 can have had deposited over a surface of MEMS device wafer 104 a first photo resist (PR) layer 202. It should be noted that while the disclosure is described in terms of photo resist layers (e.g., first photo resist layer, second photo resist layer, . . . ) the disclosure is not so limited, as mask layers (e.g., oxide hard mask layers) and/or various combinations of photo resist layers and/or mask layers are contemplated and can be used with equal functionality and/or facility without departing from the intent and/or scope of the subject disclosure.

In addition, in some embodiments, the chemical and/or physical compositions/properties of the photo resist layers (or mask layers) can be the same. In alternative and/or additional embodiments the chemical and/or physical compositions/properties of the photo resist layers can differ. Additionally, the thicknesses of the photo resist layers (or mask layers) can vary. For instance, in various embodiments, the first photo resist layer can be a first thickness and subsequent photo resist layers can be of disparate thicknesses. In alternative embodiments, the thicknesses of first photo resist layer and/or subsequent photo resist layers can be of the same thickness. In yet other embodiments, the thicknesses of second photo resist layer can be thinner than the thickness of first photo resist layer, without necessarily departing from the intent and scope of the subject disclosure.

Figure 3:
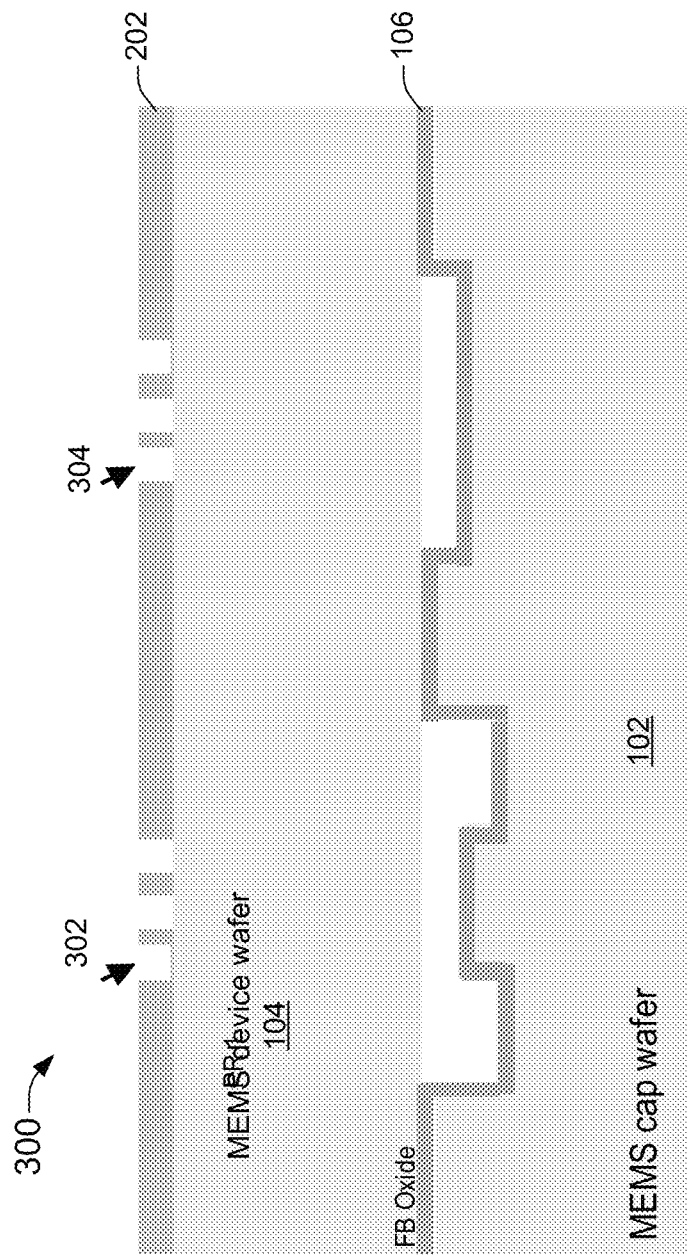
FIG. 3 illustrates a cross sectional view of a fabrication of a MEMS device to compensate for the disparities between etch rates by selectively pre-etching features that can be slower to etch, in accordance with various embodiments set forth in this disclosure.

FIG. 3 provides further detail associated with engineered silicon on insulator wafer 100 (now numbered 300), in accordance with various embodiments, wherein the first photo resist layer 202 overlaid on the surface of MEMS device wafer 104 can be exposed to a source of electromagnetic radiation to change the chemical and/or physical properties of the first photo resist layer 202 and/or the chemical and/or physical properties of the underlying MEMS device wafer 104, wherein the changed chemical and/or physical properties to the first photo resist layer 202 and/or the changed chemical and/or physical to the underlying MEM device wafer 104 can comprise one or more slow etch region 302 (e.g., regions where slow etching MEMS device geometries—vias, trenches, holes, and the like will eventually be formed or fabricated) and/or one or more fast etching regions 304 (e.g., regions or areas on the MEMS device wafer 102 where fast etching MEMS device geometries—vias, trenches, holes, will ultimately be fabricated and/or established).

It should be noted that in some embodiments, the first photo resist layer 202 overlaid on the surface of MEMS device wafer 104 can be exposed to a source of light in the electromagnetic spectrum to change the chemical and/or physical properties of the first photo resist layer 202 and/or the chemical and/or physical properties of the underlying MEMS device wafer 104, so that the chemical and/or physical properties associated with the first photo resist layer 202 and/or the underlying MEM device wafer 104 solely comprise one or more fast etching regions 304.

In additional and/or alternative embodiments, the first photo resist layer 202 overlaid on the surface of MEMS device wafer 104 can be exposed to a source of light in the electromagnetic spectrum to change the physical and/or chemical properties of the first photo resist layer 202 and/or to change the physical and/or chemical properties of the underlying MEMS device wafer 104, so that the physical and/or chemical properties associated with the first photo resist layer 202 and/or the underlying MEM device wafer 104 only comprise one or more slow etching regions 302.

In regard to the source of light or wave energy in the electromagnetic spectrum that changes the chemical and/or physical properties of the various photo resist layers, mask layers, and/or underlying wafer layers (e.g., MEMS device wafer 104 and/or MEMS cap wafer 102), the source of wave energy in the electromagnetic spectrum can be multiple and varied. For instance, in some embodiments, the source of wave energy in the electromagnetic spectrum can comprise radiation of a first determinable wavelength used to change the chemical and/or physical properties of slow etching regions 302 and fast etching regions 304. In additionally embodiments, the source of wave energy in the electromagnetic spectrum can comprise radiation of a first defined wavelength used to changed the chemical and/or physical properties of the slow etching regions 302 and a second defined wavelength used to change the chemical and/or physical properties of the fast etching regions 304. In further embodiments, the source of wave energy in the electromagnetic spectrum can comprise radiation of a first determinable wavelength used to change the chemical and/or physical properties of the underlying MEMS device wafer 104, radiation of a second determinable wavelength used to change the chemical and/or physical properties of the slow etching regions 302, and radiation of a third determinable wavelength used to change the chemical and/or physical properties of the fast aging regions 304. Further, as will be appreciated by those of ordinary skill in the art the various wave energy in the electromagnetic spectrum can be directed to the various regions (e.g., slow etching regions 302 and/or fast etching regions 304) at different defined or definable intensities and/or for disparate determined or determinable time durations. These disparate radiation wavelengths, radiation intensities, time durations, etc. can be defined or determined based on respective pattern geometries associated with the MEMS devices (e.g., at slow etching region 302 and/or fast etching region 304) that are to be fabricated on the engineered silicon on insulator wafer.

Figure 4:
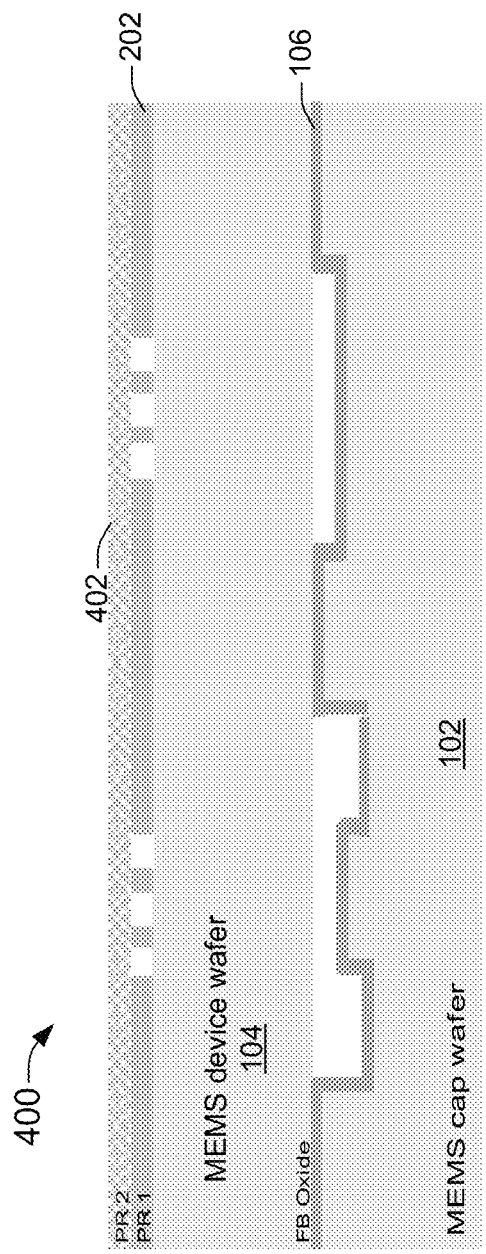
FIG. 4 illustrates a cross sectional view of a fabrication of a MEMS device to compensate for the disparities between etch rates by selectively pre-etching features that can be slower to etch, in accordance with various embodiments set forth in this disclosure.

FIG. 4 provides additional detail associated with engineered silicon on insulator wafer 100 (now numbered 400), wherein a second photo resist layer 402 can be overlaid or deposited over the first photo resist layer 202. It should be noted, the first photo resist layer 202, through exposure of the first photo resist layer 202 to an irradiating electromagnetic source (e.g., the source of wave energy in the electromagnetic spectrum), can have chemically and/or physically modified the respective underlying areas under both the first photo resist layer 202 and/or under the underlying MEMS device wafer 104 in order to fabricate, on the MEMS device wafer 104, one or more completed slow etch feature for an ultimately manufactured MEMS device and/or one or more completed fast etching feature associated with the manufactured MEMS device.

In some embodiments, the second photo resist layer 402 can be deposited atop of the first photo resist layer 202, such that, prior to overlaying the first photo resist layer 202 with the second photo resist layer 402, the first photo resist layer 202, by prior exposure to a source of electromagnetic radiation (e.g., sources of wave energy in the electromagnetic spectrum), can have had formed thereon collections comprising solely of slow etching regions 302 (e.g., no fast etching regions 304 are created at this juncture), solely of fast etching regions 304 (e.g., no slow etching regions 302 are established at this point of time), or combinations of slow etching regions 302 and fast etching regions 304. Once the second photo resist layer 402 has been deposited atop the first photo resist layer 202, the first photo resist layer 202 and the second photo resist layer 402 can be exposed to additional and/or alternate sources of electromagnetic radiation to establish collections of slow etching regions 302.

Figure 5:
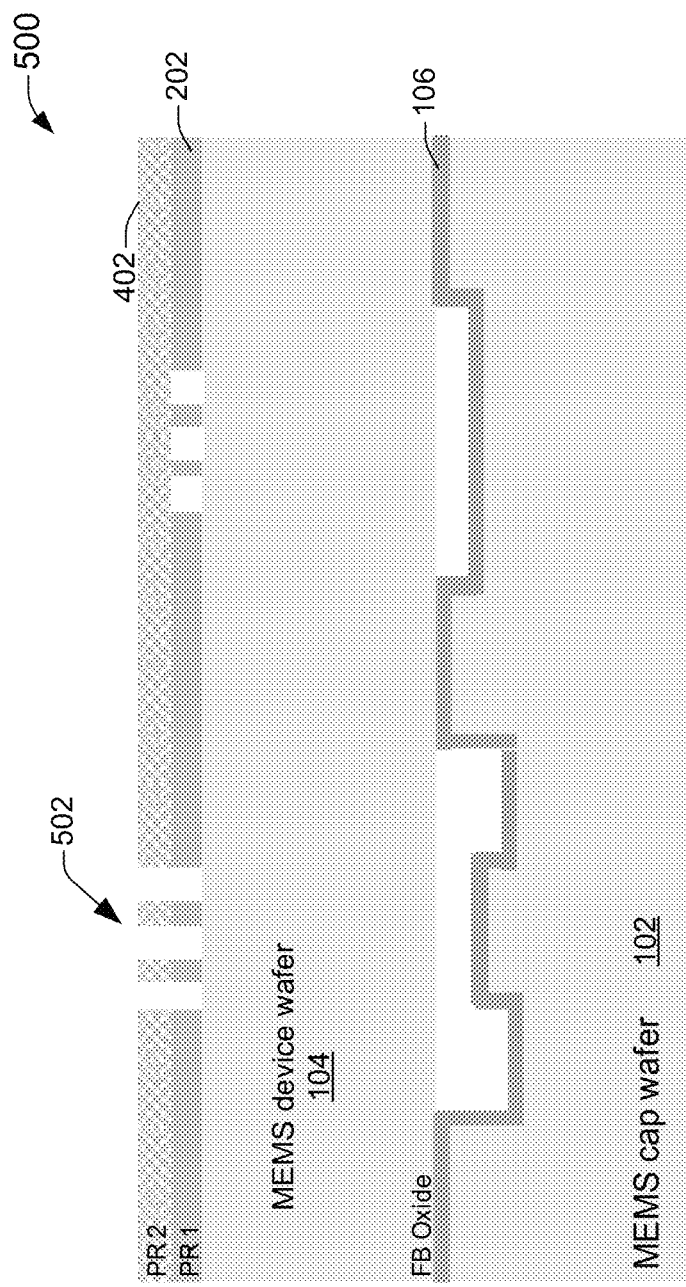
FIG. 5 illustrates a cross sectional view of a fabrication of a MEMS device to compensate for the disparities between etch rates by selectively pre-etching features that can be slower to etch, in accordance with various embodiments set forth in this disclosure.

FIG. 5 provides additional depiction of engineered silicon on insulator wafer 100 (now numbered 500), wherein the first photo resist layer 202, comprising the one or more slow etch features 302 and/or the one or more fast etching features 304, that can have been overlaid on the surface of MEMS device wafer 104, and the second photo resist layer 402 layered over the first photo resist layer 202 can be developed to establish the slow etching features 502. In additional and/or alternative embodiments, development of first photo resist layer 202 can be initiated at a first defined or first definable point in time and development of second photo resist layer 402 can be initiated at a second determined or second determinable point in time to uncover slow etching features 502. In further additional and/or alternative embodiments, development of the second photo resist layer 402 can be initiated at an initial defined point in time or an initial definable point in time and subsequent development of the first photo resist layer 202 can be initiated at a subsequent determinable point of time or a subsequent definable point in time in order to reveal slow etching features 502.

Figure 6:
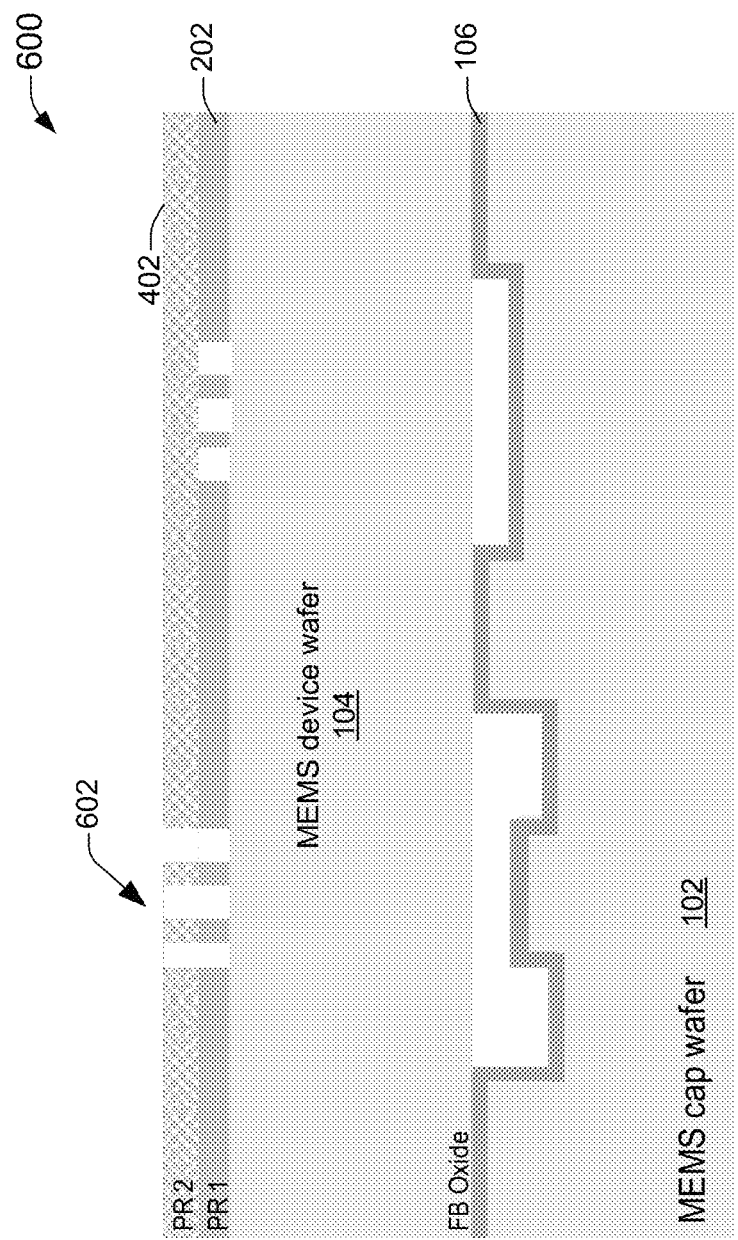
FIG. 6 illustrates a cross sectional view of a fabrication of a MEMS device to compensate for the disparities between etch rates by selectively pre-etching features that can be slower to etch, in accordance with various embodiments set forth in this disclosure.
Figure 7:
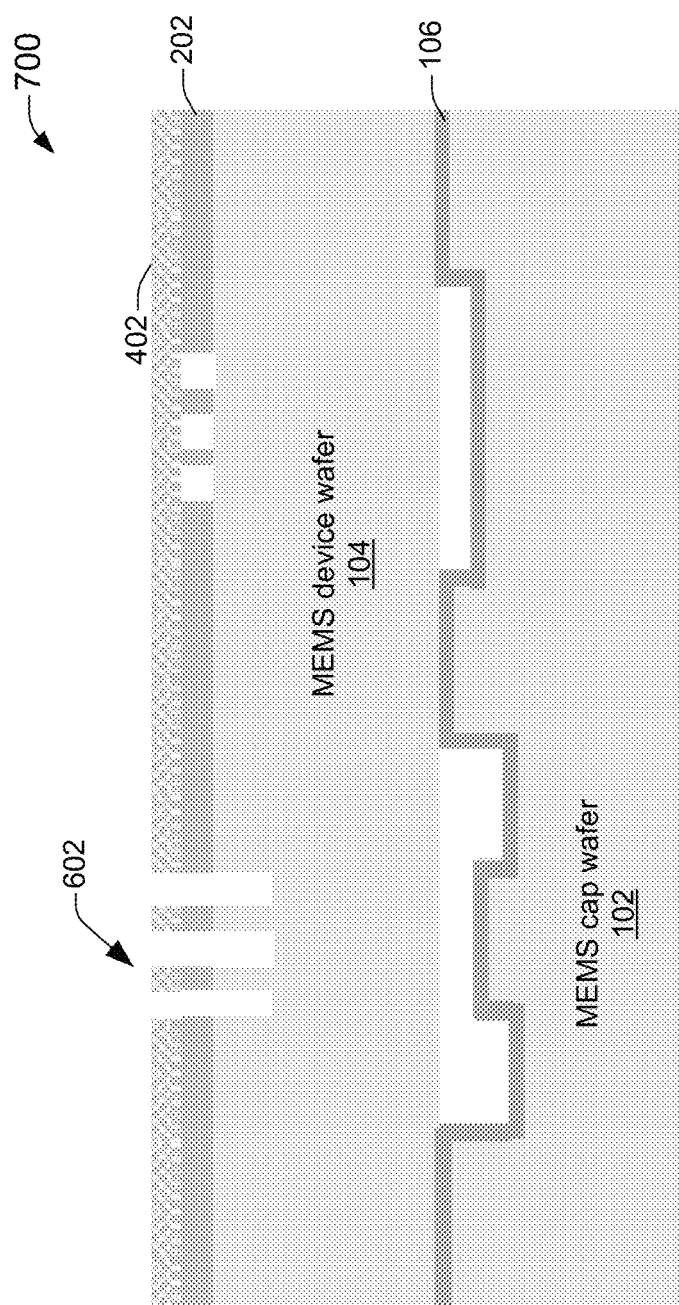
FIG. 7 illustrates a cross sectional view of a fabrication of a MEMS device to compensate for the disparities between etch rates by selectively pre-etching features that can be slower to etch, in accordance with various embodiments set forth in this disclosure.

FIG. 6 provides additional detail associated with engineered silicon on insulator wafer 100 (now numbered 600) wherein the slow etching features 502, now uncovered by developing of first photo resist layer 202 and/or the second photo resist layer 402, can be further etched to expand and/or further fabricate slow etched features 602. It will be noted in this regard that the further etching to expand and/or additionally fabricate what were slow etching regions 302 into slow etched features 602, can also include etching into the underlying MEM device wafer 104, as depicted in FIG. 7.

Figure 8:
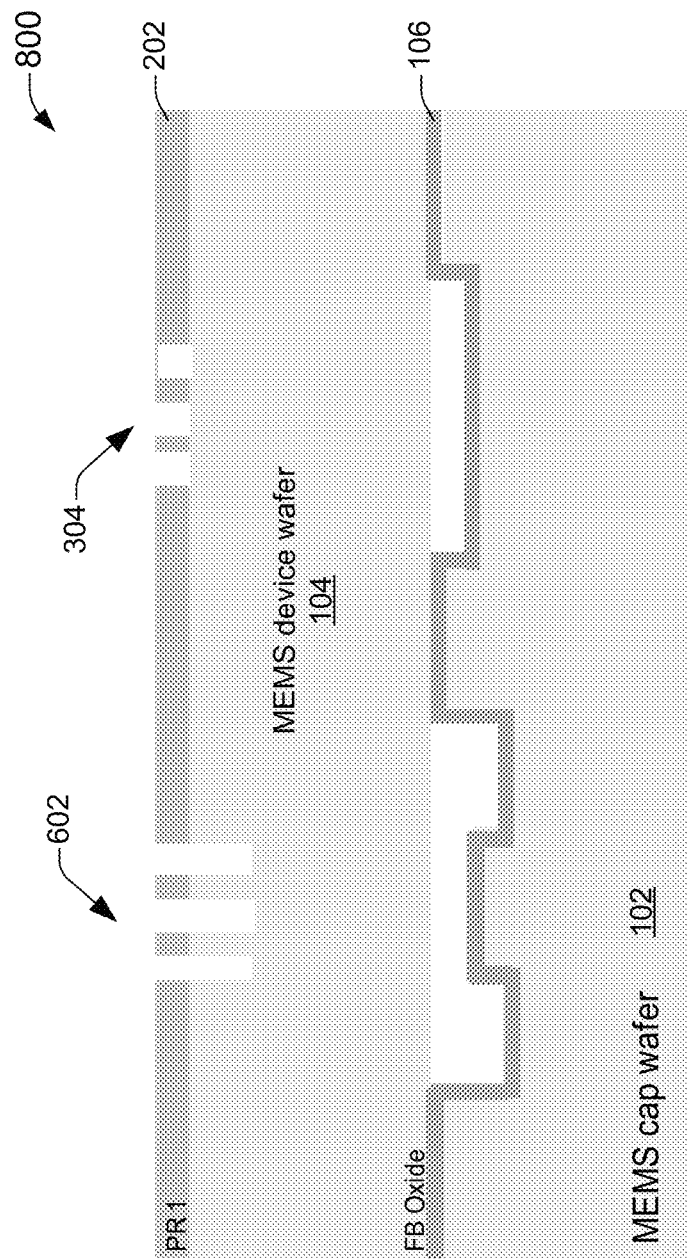
FIG. 8 illustrates a cross sectional view of a fabrication of a MEMS device to compensate for the disparities between etch rates by selectively pre-etching features that can be slower to etch, in accordance with various embodiments set forth in this disclosure.
Figure 9:
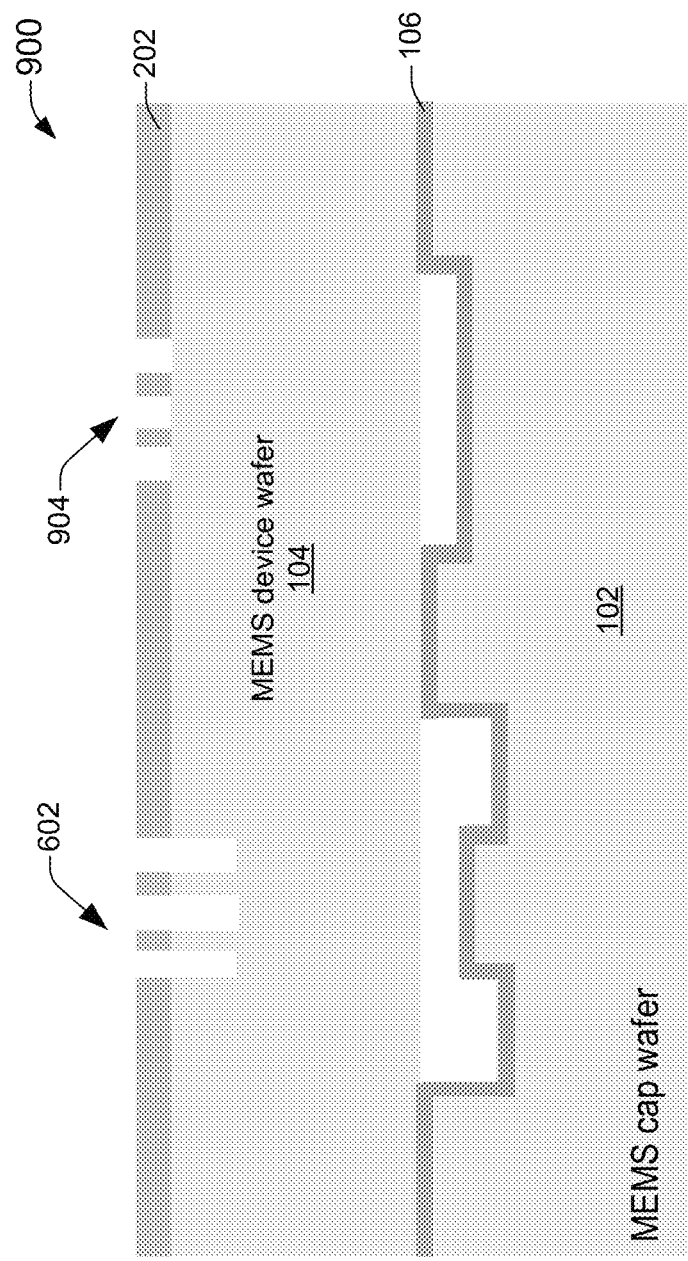
FIG. 9 illustrates a cross sectional view of a fabrication of a MEMS device to compensate for the disparities between etch rates by selectively pre-etching features that can be slower to etch, in accordance with various embodiments set forth in this disclosure.

FIG. 8 provides further illustration of engineered silicon on insulator wafer 100 (now labeled 800), wherein the second photo resist layer 402 can be removed to uncover fast etching regions 304 and the first photo resist layer 202. As has been noted earlier, fast etching regions 304 can have been initially exposed to electromagnetic radiation that can have change one or more chemical and/or physical property associated with fast etching regions 304. At this point, the first photo resist layer 202 can be additionally developed to transform the fast etching regions 304 into fast etching features 904, as depicted in FIG. 9. If necessary, additional etching to further fabricate the fast etching features 904 and/or the slow etching features 602 can also take place.

Figure 10:
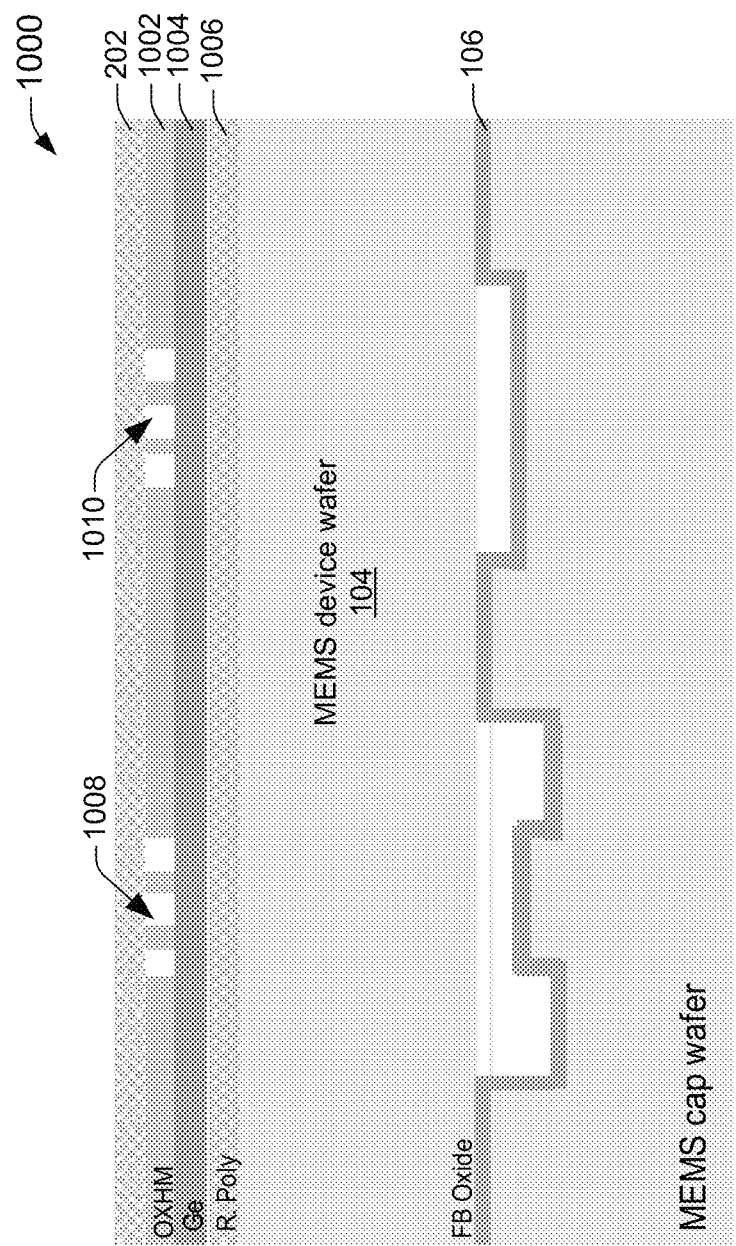
FIG. 10 illustrates a cross sectional view of a fabrication of a MEMS device to compensate for the disparities between etch rates by selectively pre-etching features that can be slower to etch, in accordance with various embodiments set forth in this disclosure.

FIG. 10 illustrates an additional and/or alternative embodiment, where the engineered silicon on insulator wafer 100 (now remunerated as 1000) comprising MEMS cap wafer 102 and MEMS device wafer 104 interposed with insulator layer 102, together with additional first photo resist layer 202. It will be observed in these embodiments, that a rough ploysilicon layer 1006 can also have been deposited over a surface of MEMS device wafer 104. Further, over the top of the rough polysilicon layer 1006 can have been deposited a metal layer 1004 (e.g., germanium layer). Additionally, deposited over the metal layer 1004 can have been deposited an oxide hard mask layer 1002. Prior to the deposition of the photo resist layer 202 over the oxide hard mask layer 1002, the oxide hard mask layer 1002 can have been patterned. The patterning can have created one or more slow etching regions 1008 (e.g., corresponding to slow etching regions 302) and/or fast etching regions 1010 (e.g., corresponding to fast etching regions 304). The one or more slow etching regions 1008 and/or fast etching regions 1010 can thereafter be processed in accordance with the process depicted in FIGS. 1-9.

Figure 11:
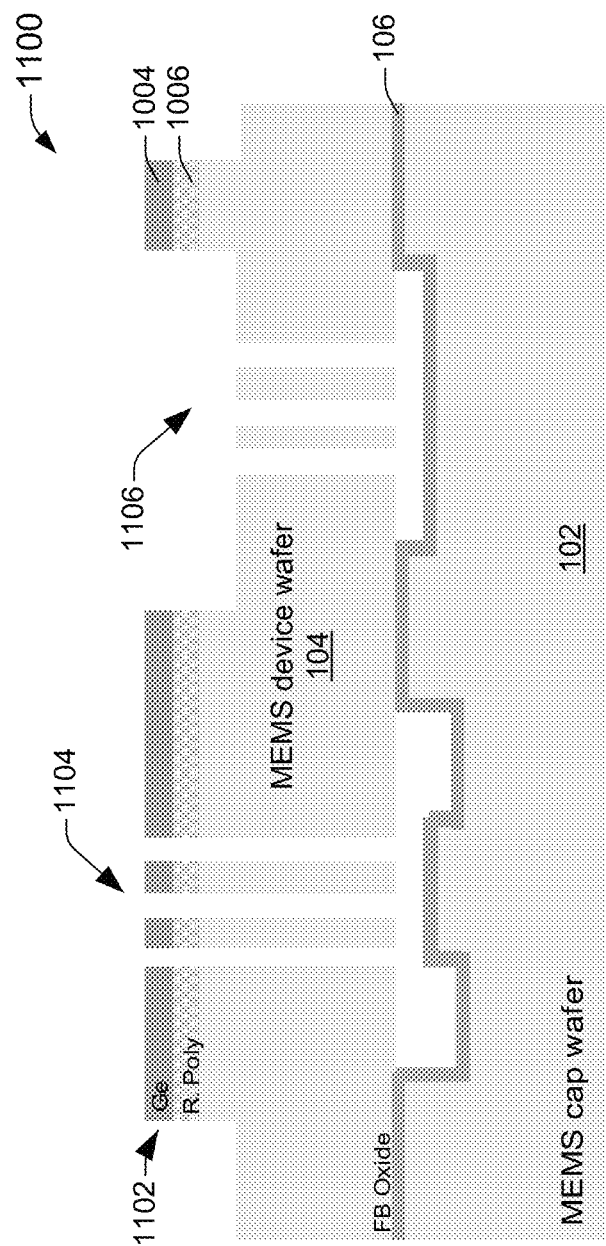
FIG. 11 illustrates a cross sectional view of a fabrication of a MEMS device to compensate for the disparities between etch rates by selectively pre-etching features that can be slower to etch, in accordance with various embodiments set forth in this disclosure.

FIG. 11 provides illustration of a completed MEMS device fabricated in accordance with embodiments set forth in the subject disclosure. In FIG. 11, the engineered silicon on insulator wafer 100 (now remunerated as 1000) comprises MEMS cap wafer 102 and MEMS device wafer 104, wherein a insulator layer 106 is interposed between the MEMS cap wafer 102 and MEMS device wafer 104. In this embodiment, the completed MEMS device can comprise one or more standoff formation 1102. As illustrated, standoff formation 1102 can comprise selected portions of MEM device wafer 104, rough polysilicon layer 1006, and/or metal layer 1004. It should be noted that in some embodiments, standoff formation 1102 can omit one or more of the rough polysilicon layer 1006 and/or metal layer 1004. Accordingly, in some embodiments standoff formation 1102 can comprise solely of selected areas of MEMS device wafer 104. In other embodiments, standoff formation 1102 can comprise selected areas of MEMS device wafer 104 and rough polysilicon layer 1006.

With reference to FIG. 11, it will be noted that in various embodiments, the etching regions (e.g., slow etching region 1008 and/or fast etching region 1010 illustrated in FIG. 10), using one or more of the processes outlined in relation to FIGS. 1-9, can be transformed into fabricated MEMS device features 1104 and/or MEMS device features 1106. It will be noted in the context fabricated MEMS device features 1104 and/or MEMS device features 1106, that some aspects of the fabricated MEMS device can be flush with a top layer of the fabricated MEMS device. For instance, MEMS device feature 1104 can be fabricated to be flush with a top layer (e.g., metal layer 1004). In other instances, MEMS device feature 1106 can be fabricated to be recessed within a cavity or void formed in MEM device wafer 104.

Figure 12:
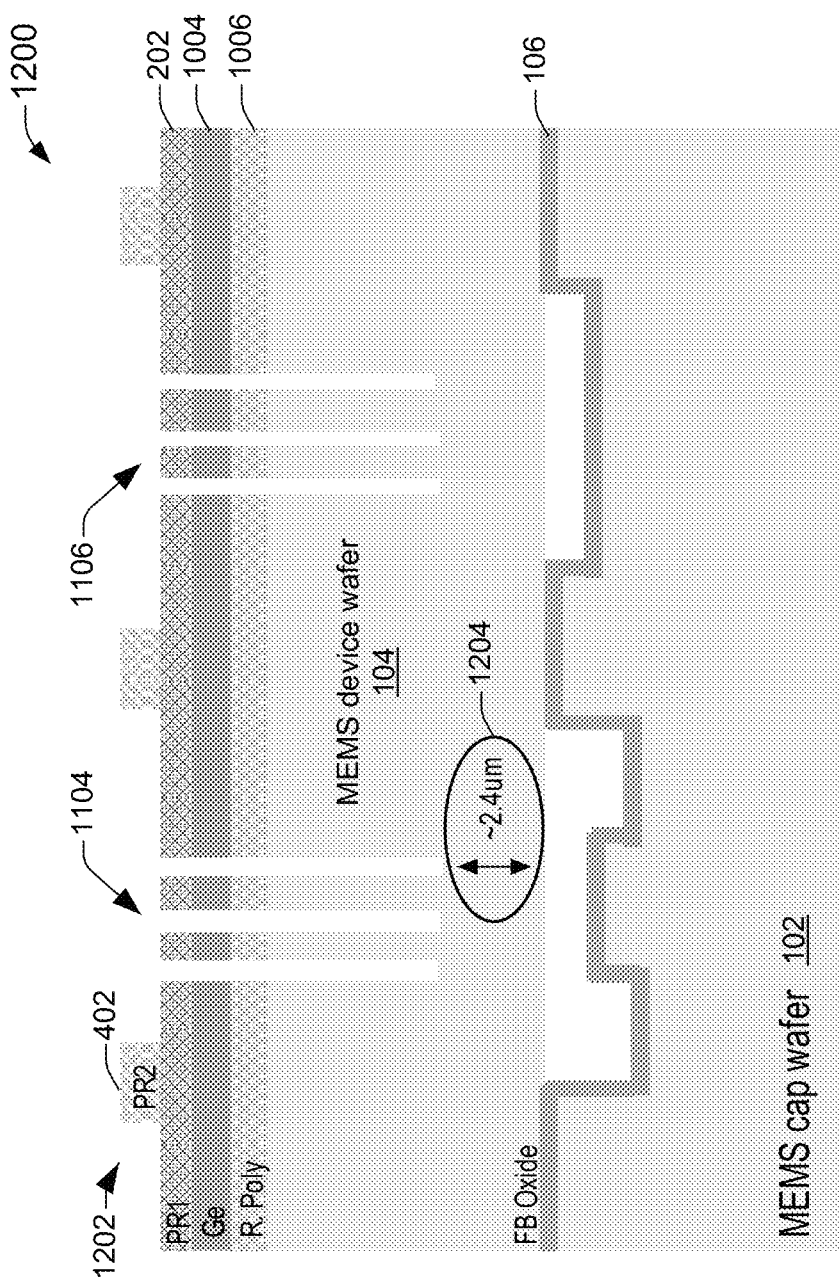
FIG. 12 illustrates a cross sectional view of a fabrication of a MEMS device to compensate for the disparities between etch rates by selectively pre-etching features that can be slower to etch, in accordance with various embodiments set forth in this disclosure.

FIG. 12 illustrates an intermediate development of the MEMS device 1200 fabricated in accordance with embodiments set forth in the subject disclosure. As illustrated, it will be noted that standoff formation 1202 is in an early stage (e.g., in comparison to completed standoff 1102). At this preliminary stage, standoff formation 1202 comprises second photo resist layer 402 and first photo resist layer 202, that have yet to be removed. Metal layer 1004, rough ploy layer 1006, and optionally defined or indentified areas of MEMS device wafer 104 have yet to be etched. Further, it will be noted that MEMS device features 1104 and 1106 have been etched to a defined depth 1204 below a reference point into the MEMS device wafer 104.

Figure 13:
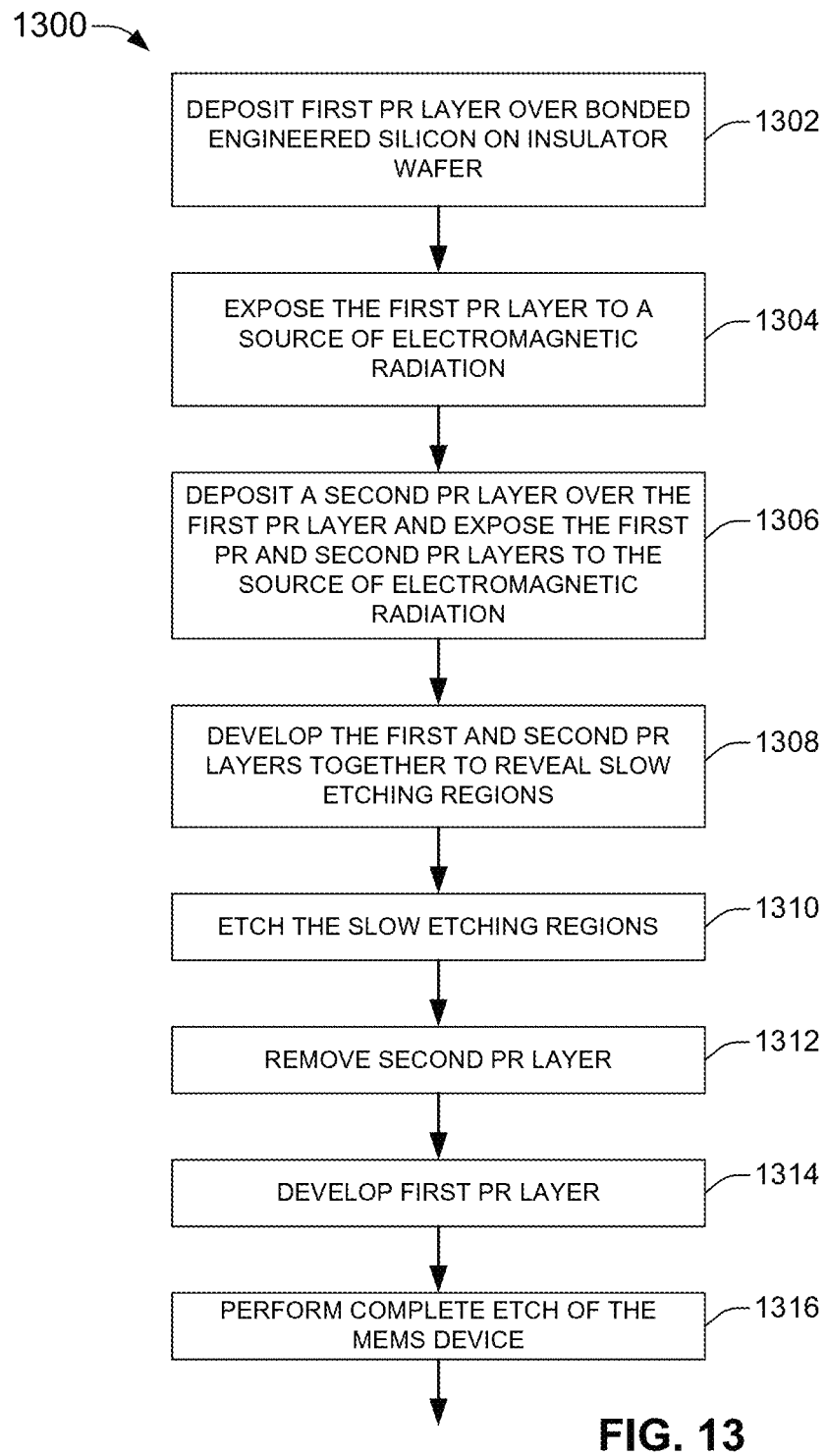
FIG. 13 illustrates a high-level example, non-limiting method for compensating for the disparities between etch rates by selectively pre-etching features that can be slower to etch and/or and for the mitigation of photo resist pooling, in accordance with one or more embodiments described herein.

FIG. 13 illustrates a process flow or method 1300 for DRIE matched release and/or for the mitigation of photo resist pooling in accordance with various embodiments. Method 1300 can commence at act 1302 wherein a first photo resist (or mask) layer can be deposited over a bonded engineered silicon on insulator wafer. At 1304 the first photo resist (or mask) layer can be exposed to a source of electromagnetic radiation. At 1306 a second photo resist (or mask) layer can be deposited over the first photo resist (or mask) layer, and the second photo resist (or mask) layer and the first photo resist (or mask) layer can be exposed to a source of electromagnetic radiation. At 1308 the first photo resist (or mask) layer and the second photo resist (or mask) layer can be developed to reveal slow etching regions. At 1310 the slow etching regions can be etched to form one or more MEMS device features. At 1312 the second photo resist (or mask) layer can be removed. At 1314 the first photo resist (or mask) layer can be developed, and at 1316 a complete etching can be performed to fabricate a completed MEMS device.

In accordance with various embodiments, instead of using two photo resist mask another masking layer can be used. Thus to a bonded engineered silicon on insulator wafer comprising a MEMS cap wafer 102 and a MEMS device wafer 104, wherein an insulator layer 106 can have been deposited and sandwiched between the MEMS cap wafer 102 and the MEMS device layer 104, a rough polysilicon layer 1006, can have been deposited over the top of the MEMS device wafer 104. On top of the rough polysilicon layer can have been deposited a metal layer 1004 (e.g., germanium layer). Over the top of the metal layer 1004 can be deposited a first mask layer 1002. The first mask layer 1002 in some embodiments can be a oxide hard mask. The oxide hard mask, in these embodiments, can an alternative to a first photo resist layer that has been exposited in relation to earlier embodiments and described in earlier depictions of the fabrication of MEMS devices. In these embodiments the first mask layer (e.g., oxide hard mask layer) can be patterned to precisely describe aspects that can be crucial to formation of a fully functional and completed MEMS device, and/or aspects of the completed MEMS device that can ensure conformance to critical feature geometries that can be deleteriously affected by thickness variations (pooling) in spun on photo resist.

Once the first mask layer has been deposited and/or patterned, a second mask layer 202 can be overlaid on top of the first mask layer 1002 (e.g., inclusive of any patterning that can have taken place). The second mask layer 202, in various embodiments, can be a photo resist layer. The second mask layer 202, on completion of its deposition, can be exposed to a source of wave energy in the electromagnetic spectrum and exposed.

The photolithographic image of the silicon actuator can then be etched to fabricate the completed MEMS device. Additional fabrication processes can be applied, wherein the first mask layer 1002 can be removed and one or more standoff structures 1202 can be formed by variously etching the metal layer 1004, the rough polysilicon layer 1006, and/or into the MEMS device layer 104.

As has been noted, topological features on wafers can create thickness variations (e.g., pooling) to mask layers (e.g., photo resist) spun on thicknesses. Generally, mask layer thicknesses can be determinative of one or more critical feature definitions during photolithography. Thus, topological features themselves can create mask thickness variations which in turn can cause undesirable variations in critical feature dimensions.

In order to address the foregoing issue of topological features creating variations in mask thicknesses causing undesirable variations in critical feature dimensions, the following process details a technique wherein two masks can be used to precisely pattern critical MEMS device geometries. An initial mask can be used to pattern, with exact precision, critical MEMS device geometries, and a secondary mask deposited over the first mask can be employed to pattern less critical MEMS device geometries.

Figure 14:
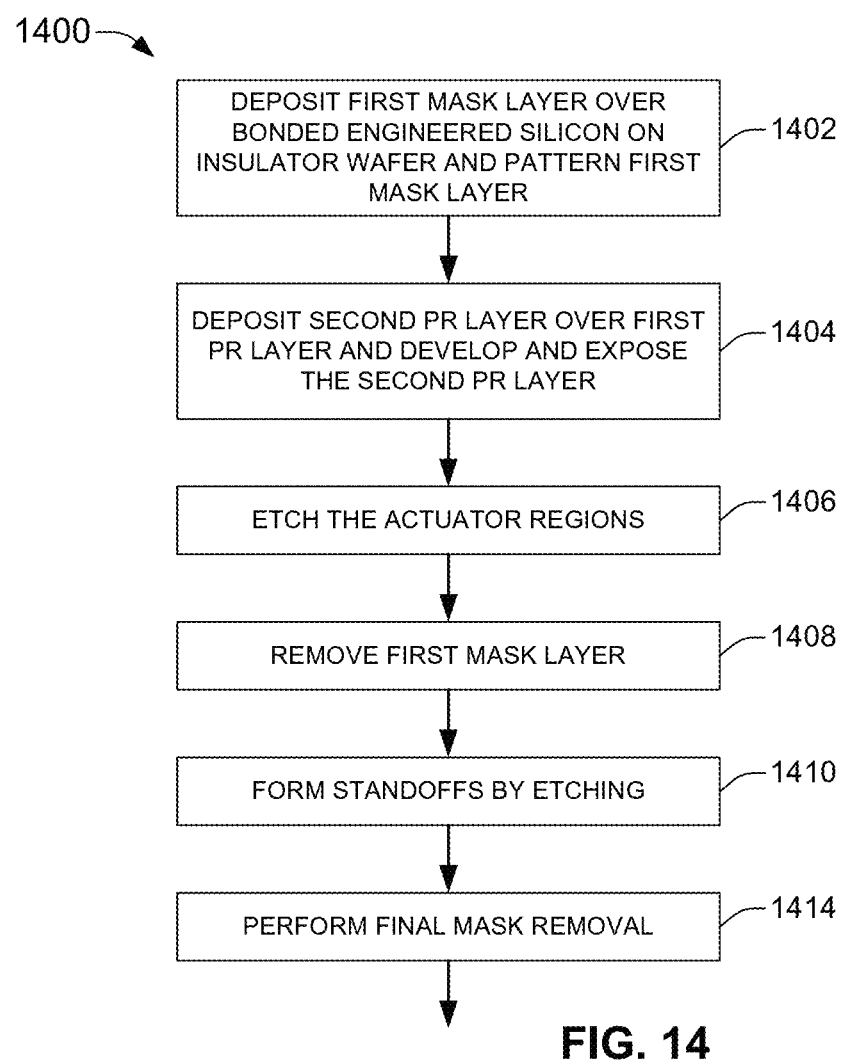
FIG. 14 illustrates a high-level example, non-limiting method for compensating for the disparities between etch rates by selectively pre-etching features that can be slower to etch and/or and for the mitigation of photo resist pooling, in accordance with one or more embodiments described herein

FIG. 14 depicts a further process flow or method 1400 $r$ for the mitigation of photo resist pooling in accordance with various embodiments. Method 1400 can begin at act 1402 wherein a first mask layer (e.g., hard mask layer for creating exact precisely describe aspects crucial to the formation of a functional and completed MEMS device) can be deposited over a bonded engineered silicon on insulator wafer also referred as MEMS substrate layer. In this instance, the MEMS substrate layer of rough polysilicon and a layer of metal, wherein the first mask layer can typically be deposited over the metal layer. In some embodiments, the metal layer could Germanium or Aluminum. At 1402 the first mask layer can be exposed with areas that require exact and precise formations (e.g., device formations that can adversely affect the functionality of the completed MEMS device) and/or areas comprising formations that are not so critical to the functionality of the fabricated MEM device. At 1404 a second mask layer (a photo resist layer) can be deposited atop of the exposed first mask layer. Also at 1404 the second mask layer can be exposed to a source of wave energy in the electromagnetic spectrum (e.g., light amplification by stimulated emission of radiation (laser)). At 1406 the exposed portions of the second mask layer can be etched to form standoffs and revealing the exposed portions of the first mask layer. In 1407, the MEMS substrate layer is etched though the metal layer, rough poly silicon layer and the device layers. at the exposed portions of the first mask layer.

Thereafter, the first mask layer can be removed at act 1408. Once the first mask layer has been removed at act 1408, one or more standoff formations can be etched at 1410. On completion of the standoff formations, at 1412, a final mask removal can be undertaken at act 1414.

Figure 15A:
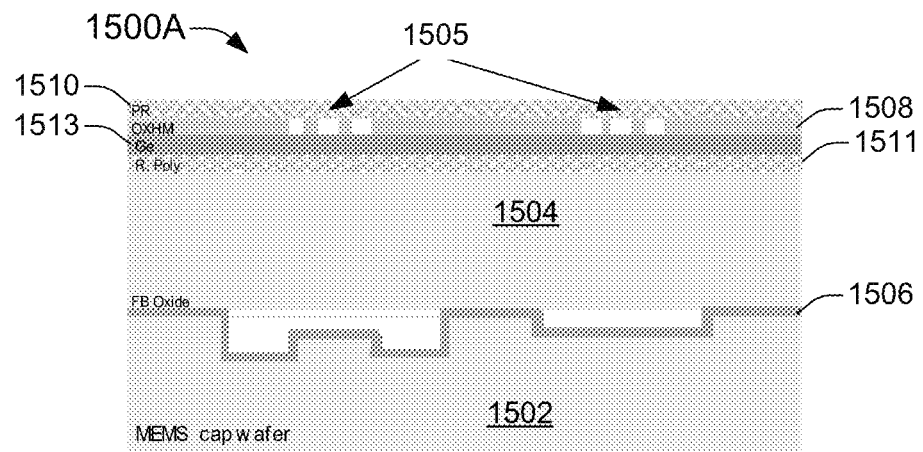
FIG. 15A-15F illustrates a cross sectional view of a fabrication of a MEMS device to uneven deposition of photo-resist layers

FIG. 15A-FIG. 15F describes the process steps in mitigating photo resist pooling. FIG. 15A, in accordance with various embodiments, depicts a bonded engineered silicon on insulator wafer 1500A comprising a MEMS cap wafer 1502 and a MEMS device wafer 1504, wherein an insulator layer 1506 (e.g., fusion bond oxide) can be formed between the MEMS cap wafer 1502 and the MEMS device wafer 1502.

A first photo resist (PR) layer 1508 is deposited over the MEMS device wafer 1504 and portions of the first mask layers 1505 are exposed. The exposed portions indicate the MEMS device etching portions. A second photo resist layer 1510 is then deposited over the first mask layer 1508. It should be noted that while the disclosure is described in terms of photo resist layers (e.g., first photo resist layer, second photo resist layer, . . . ) the disclosure is not so limited, as mask layers (e.g., oxide hard mask layers) and/or various combinations of photo resist layers and/or mask layers are contemplated and can be used with equal functionality and/or facility.

In addition, in some embodiments, the chemical and/or physical compositions/properties of the photo resist layers (or mask layers) can be the same. In alternative and/or additional embodiments the chemical and/or physical compositions/properties of the photo resist layers can differ. Additionally, the thicknesses of the photo resist layers (or mask layers) can vary. For instance, in various embodiments, the first photo resist layer can be a first thickness and subsequent photo resist layers can be of disparate thicknesses. In alternative embodiments, the thicknesses of first photo resist layer and/or subsequent photo resist layers can be of the same thickness. In yet other embodiments, the thicknesses of second photo resist layer can be thinner than the thickness of first photo resist layer, without necessarily departing from the intent and scope of the subject disclosure.

In some embodiments, a layer of rough polysilicon 1511 is deposited over the MEMS device 1504 and a layer of metal 1513 such as Germanium or Aluminum is deposited over the rough polysilicon layer 1511 before depositing the first mask layer 1508.

Figure 15B:
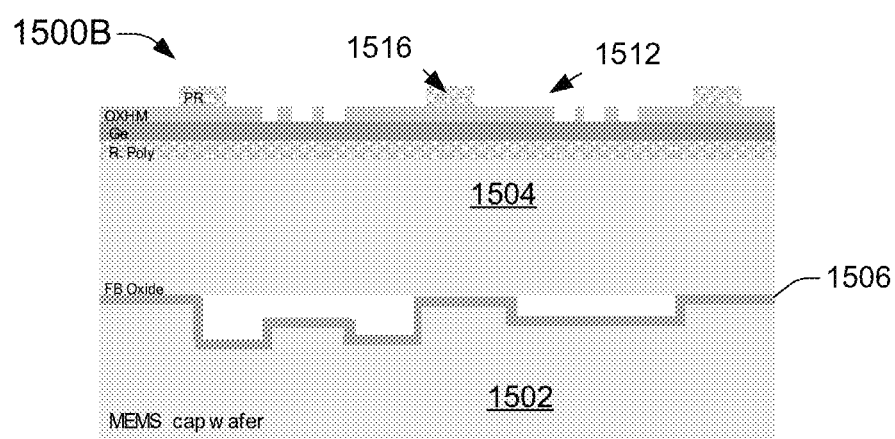

FIG. 15B provides details of the next step where portions of the second mask layer 1512 are etched there by masking only the standoff regions 1516. In this step the second photo resist layer 1510 can be removed to uncover etching regions 1505 and the first photo resist layer 1508. As has been noted earlier, etching regions 1505 can have been initially exposed to electromagnetic radiation that can have change one or more chemical and/or physical property associated with etching regions 1505.

Figure 15C:
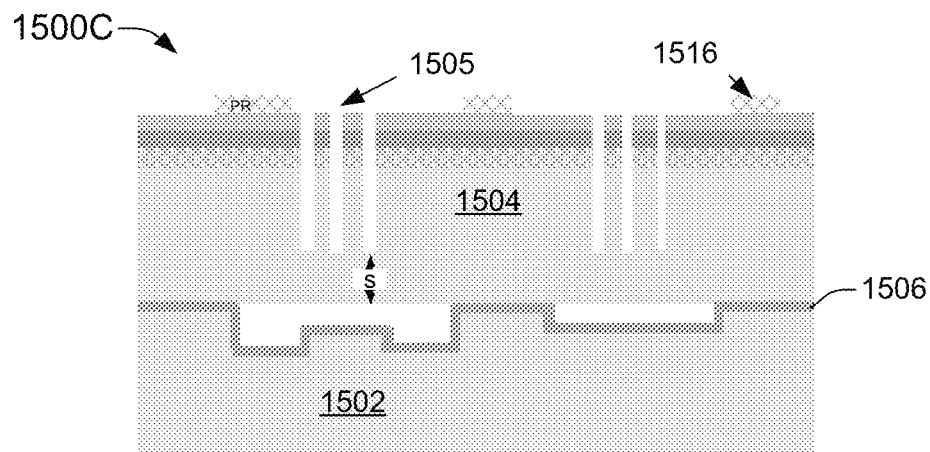

FIG. 15C provides further detail associated with engineered silicon on insulator wafer 1500C. In this step the exposed portions of the first mask layer is etched which eventually etches the device layer 1504 at 1505 to a certain depth 's'. The depth at which etching stops 's', is equivalent to the standoff height. In this step the metal 1513 and rough-poly silicon 1511 layers are also etched.

Figure 15D:
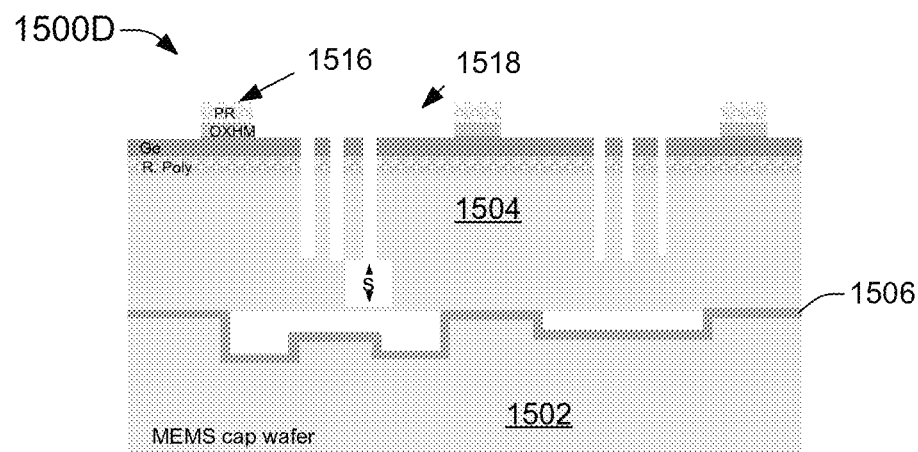
Figure 15E:
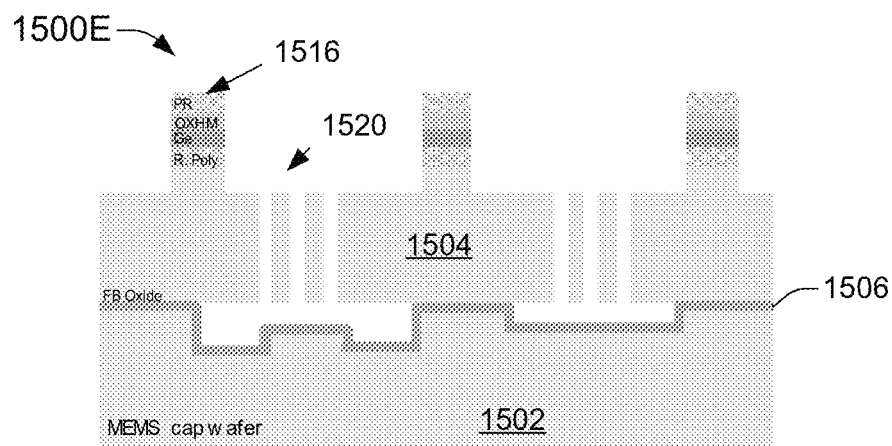
Figure 15F:
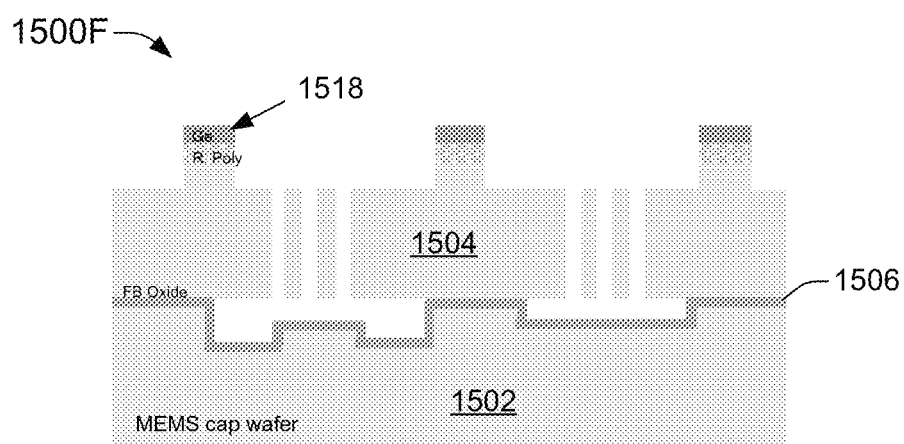

FIG. 15D provides further detail associated with etching the first mask layer leaving the mask on the standoff region 1516 and exposing the metal layers in region 1518. FIG. 15E provides further detail associated with etching the metal, and rough polysilicon layers at 1518 hereby exposing MEM device layer at 1520. Finally, the device layer is etched at 1520 to form standoff and also etch the device layers at region 1520 to etch MEMS features and release the device. FIG. 15F shows the process of removing the oxide layers at 1516 to expose the metal layer at the standoff 1518. MEMS substrate is then boned to another substrate at the standoff.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above-described components, devices, systems and the like, the terms (including reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified subcomponents, some of the specified components or subcomponents, and/or additional components, and according to various permutations and combinations of the foregoing. Subcomponents can also be implemented as components communicatively coupled to other components rather than included within parent components (hierarchical). Additionally, it should be noted that one or more components may be combined into a single component providing aggregate functionality or divided into several separate subcomponents, and any one or more middle layers, may be provided to communicatively couple to such subcomponents in order to provide integrated functionality. Any component described herein may also interact with one or more other components not specifically described herein.

In addition, while a particular feature of the subject disclosure may have been disclosed with respect to only one of the several implementations, such feature may be combined with one or more other features of the other implementations as may be desired and advantageous for any given or particular application. Furthermore, to the extent that the terms "includes," "including," "has," "contains," or variants thereof, and other similar words are used in either the detailed description or the claims, these terms are intended to be inclusive in a manner similar to the term "comprising" as an open transition word without precluding any additional or other elements.

What is claimed is:
1. A method, comprising:
depositing a continuous first mask layer of uniform thickness over a first surface of a MEMS silicon substrate;
exposing a first portion and a second portion of the continuous first mask layer to a first etch process, wherein the exposing forms a first exposed layer;
depositing a second mask layer over the first mask layer;
exposing a third portion of the second mask layer to a second etch process, wherein the exposing forms a second exposed mask layer, and wherein the third portion overlaps the first portion of the first mask layer;
developing the second mask layer and etching the third portion of the second mask layer and developing the first portion of the first mask layer;
etching the first portion of the continuous first mask layer and the MEMS silicon substrate to a first depth; and
developing the continuous first mask layer to reveal exposed portions of the continuous first mask layer and etching the second portion of the continuous first mask layer and the MEMS silicon substrate to a second depth.

2. The method of claim 1, wherein a first portion of the MEMS silicon substrate comprises slow etching features representing densely packed microelectromechanical device features.

3. The method of claim 1, wherein the second portion of the MEMS silicon substrate comprises fast etching features representing less densely packed microelectromechanical device features.

4. The method of claim 1, wherein the continuous first mask layer comprises an oxide hardmask layer.

5. The method of claim 1, wherein the continuous first mask layer comprises a metal mask layer.

6. The method of claim 1, wherein the continuous first mask layer comprises a silicon nitride layer.

7. The method of claim 1, wherein the second mask layer comprises a photoresist layer.

8. The method of claim 1, further comprising removing the second mask layer before developing the first mask layer.

9. The method of claim 1, further comprising performing a completion etch process to reveal at least one hole.

10. A method, comprising:
depositing a continuous first mask layer over a first surface of a silicon substrate;
exposing a first portion of the continuous first mask layer to a first etch process, wherein the exposing forms a first exposed mask layer representing a critical dimension geometry associated with a fabricated device, wherein the critical dimension geometry represents a first mask layer thickness;
depositing a second mask layer over the continuous first mask layer and the first exposed mask layer;
exposing a second portion of the second mask layer to a second etch process, wherein the second portion of the second mask layer overlaps the first portion of the continuous first mask layer, and wherein the exposing of the second portion forms a second exposed mask layer representing dimension geometries of secondary importance to the fabricated device, wherein the dimension geometries of secondary importance represent second mask layer thicknesses;
exposing a third portion of the second mask layer;
developing the first exposed mask layer and the second exposed mask layer; and
etching the silicon substrate.

11. The method of claim 10, further comprising depositing a rough polysilicon layer directly over the silicon substrate before deposition of the first mask layer.

12. The method of claim 11, further comprising depositing a germanium layer over the rough polysilicon layer before deposition of the first mask layer.

13. The method of claim 12, further comprising etching the germanium layer to form a standoff structure comprising at least the germanium layer.

14. The method of claim 12, further comprising etching the rough polysilicon layer to form a standoff structure comprising at least the rough polysilicon.

15. The method of claim 10, further comprising removing the first mask layer.

16. The method of claim 10, further comprising removing the second mask layer.

17. The method of claim 10, further comprising etching the silicon substrate to form a standoff structure.

18. The method of claim 10, wherein the continuous first mask layer comprises an oxide hardmask, a metal mask, a silicon nitride mask, or a photo resist, and wherein the second mask layer comprises a photo resist.

* * * * *